(12) United States Patent
Ishikawa et al.

(10) Patent No.: US 11,289,415 B2
(45) Date of Patent: Mar. 29, 2022

(54) SEMICONDUCTOR DEVICE INCLUDING SEMICONDUCTOR CHIP HAVING ELONGATED BUMPS

(71) Applicant: Murata Manufacturing Co., Ltd., Kyoto-fu (JP)

(72) Inventors: Mizuho Ishikawa, Nagaokakyo (JP); Kazuhiro Ueda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 38 days.

(21) Appl. No.: 16/588,700

(22) Filed: Sep. 30, 2019

(65) Prior Publication Data
US 2020/0111731 A1    Apr. 9, 2020

(30) Foreign Application Priority Data
Oct. 5, 2018   (JP) .............................. JP2018-189996

(51) Int. Cl.
*H01L 23/498*     (2006.01)
*H01L 23/00*      (2006.01)
(Continued)

(52) U.S. Cl.
CPC ........ *H01L 23/49838* (2013.01); *H01L 23/66* (2013.01); *H01L 24/14* (2013.01);
(Continued)

(58) Field of Classification Search
CPC ... H01L 23/49838; H01L 24/14; H01L 24/81; H01L 24/16; H01L 23/66; H01L 2224/16058; H01L 2224/1403; H01L 23/49894; H01L 24/17; H01L 24/13; H01L 2224/131; H01L 2224/14177; H01L 2223/6644; H01L 2224/14051;
(Continued)

(56) References Cited

U.S. PATENT DOCUMENTS 6,218,630 B1 *  4/2001  Takigami ............. H05K 3/3452
                                              174/261
10,797,218 B2 * 10/2020 Kaneda .............. H03H 9/02559
(Continued)

FOREIGN PATENT DOCUMENTS

JP    H08-179154 A    7/1996
JP    H10-505466 A    5/1998
(Continued)

*Primary Examiner* — Alexander O Williams
(74) *Attorney, Agent, or Firm* — Studebaker & Brackett PC

(57) ABSTRACT

A semiconductor chip is mounted on a mounting substrate. The semiconductor chip includes plural first bumps on a surface facing the mounting substrate. The plural first bumps each have a shape elongated in a first direction in plan view and are arranged in a second direction perpendicular to the first direction. The mounting substrate includes, on a surface on which the semiconductor chip is mounted, at least one first land connected to the plural first bumps. At least two first bumps of the plural first bumps are connected to each first land. The difference between the dimension of the first land in the second direction and the distance between the outer edges of two first bumps at respective ends of the arranged first bumps connected to the first land is 20 μm or less.

17 Claims, 9 Drawing Sheets

(51) Int. Cl.
  *H05K 3/34* (2006.01)
  *H05K 1/02* (2006.01)
  *H01L 23/66* (2006.01)

(52) U.S. Cl.
  CPC .............. *H01L 24/16* (2013.01); *H01L 24/81* (2013.01); *H05K 1/0237* (2013.01); *H05K 3/34* (2013.01); *H01L 2224/1403* (2013.01); *H01L 2224/14051* (2013.01); *H01L 2224/16058* (2013.01); *H05K 2203/04* (2013.01)

(58) Field of Classification Search
  CPC ... H01L 2224/13014; H01L 2224/1416; H01L 2224/14164; H01L 2224/16012; H01L 2224/13147; H01L 2224/81191; H01L 2224/14151; H01L 24/05; H01L 2224/16227; H01L 2224/13082; H01L 2224/81143; H01L 2224/0401; H01L 2924/142; H01L 2924/014; H01L 2924/00014; H01L 2224/13013; H01L 2924/00012; H01L 2224/17106; H01L 2224/2224; H01L 2224/1415; H01L 2224/14154; H01L 2224/81385; H01L 23/498; H01L 23/00; H05K 3/34; H05K 1/0237; H05K 2203/04; H05K 3/3436; H05K 1/02
  USPC .................................. 257/737, 738, 778, 779
  See application file for complete search history.

(56) References Cited

U.S. PATENT DOCUMENTS

| | | | | |
|---|---|---|---|---|
| 10,971,466 | B2* | 4/2021 | Nakazawa | H01L 23/3677 |
| 2004/0100778 | A1* | 5/2004 | Vinciarelli | H05K 1/141 |
| | | | | 361/760 |
| 2005/0155706 | A1* | 7/2005 | Nishida | H01L 23/295 |
| | | | | 156/312 |
| 2005/0199995 | A1* | 9/2005 | Nomoto | H01L 23/34 |
| | | | | 257/692 |
| 2005/0224560 | A1* | 10/2005 | Takesue | B23K 1/0016 |
| | | | | 228/180.22 |
| 2009/0260230 | A1* | 10/2009 | Motomura | H05K 3/341 |
| | | | | 29/840 |
| 2010/0027225 | A1* | 2/2010 | Yuda | H05K 1/0218 |
| | | | | 361/736 |
| 2014/0103543 | A1* | 4/2014 | Nagai | H01L 24/17 |
| | | | | 257/777 |
| 2016/0276236 | A1* | 9/2016 | Bang | H01L 21/486 |
| 2017/0278819 | A1* | 9/2017 | Kawamura | H01L 24/81 |
| 2018/0063952 | A1* | 3/2018 | Noguchi | H01L 23/562 |
| 2019/0326191 | A1* | 10/2019 | Kondo | H01L 23/49822 |

FOREIGN PATENT DOCUMENTS

| | | |
|---|---|---|
| JP | 2015-41760 A | 3/2015 |
| JP | 2015-149328 A | 8/2015 |

* cited by examiner

SEMICONDUCTOR DEVICE INCLUDING SEMICONDUCTOR CHIP HAVING ELONGATED BUMPS

CROSS-REFERENCE TO RELATED APPLICATION

This application claims benefit of priority to Japanese Patent Application No. 2018-189996, filed Oct. 5, 2018, the entire content of which is incorporated herein by reference.

BACKGROUND

Technical Field

The present disclosure relates to a semiconductor device.

Background Art

Flip-chip bonding is known as a method for mounting a semiconductor chip on mounting substrates including printed circuit boards (PCB), low temperature co-fired ceramics (LTCC) boards and ceramics boards. A semiconductor chip to be subjected to flip-chip bonding includes plural bumps, and a mounting substrate includes plural lands. The semiconductor chip is mounted on the mounting substrate by connecting the bumps and the lands to each other by soldering.

Bumps typically used have a substantially circular planar shape or a rectangular or racetrack planar shape elongated in one direction. When solder is transferred to the upper surface of a bump, the melted solder rises due to surface tension. In plan view, the area of a bump having a shape elongated in one direction is larger than the area of a bump having a substantially circular shape. Thus, the height of the solder transferred to the bump having a shape elongated in one direction is higher than that of the solder transferred to the bump having a substantially circular shape. Japanese Unexamined Patent Application Publication No. 2015-41760 discloses an electronic device in which connection failure is unlikely to occur if the heights of the solders transferred to bumps vary.

In the electronic device disclosed in Japanese Unexamined Patent Application Publication No. 2015-41760, the ratio of the area of a land to the area of the corresponding bump elongated in one direction is higher than the ratio of the area of a land to the area of the corresponding substantially circular bump, in plan view. Such a structure provides an effect of improving the connectivity between the bump and the land.

SUMMARY

When flip-chip bonding is performed, due to the self-alignment effect provided by the surface tension of solder, the relative position between a bump and a land is substantially self-alignedly determined. However, when the area of a land is larger than the area of the corresponding bump in the same manner as in the related art, the self-alignment effect is degraded, and thus, the positions of lands with respect to bumps are likely to vary.

Accordingly, the present disclosure provides a semiconductor device in which faulty positioning is unlikely to occur when a land is larger than a bump.

According to a preferred embodiment of the present disclosure, there is provided a semiconductor device including a mounting substrate and a semiconductor chip mounted on the mounting substrate. The semiconductor chip includes a plurality of first bumps on a surface facing the mounting substrate. The plurality of first bumps each have a shape elongated in a first direction in plan view and being arranged in a second direction perpendicular to the first direction. The mounting substrate includes, on a surface on which the semiconductor chip is mounted, at least one first land connected to the plurality of first bumps, with at least two first bumps of the plurality of first bumps being connected to each first land. The difference between the dimension of the first land in the second direction and the distance between the outer edges of two first bumps at respective ends of the arranged first bumps connected to the first land is 20 μm or less.

According to another preferred embodiment of the present disclosure, there is provided a semiconductor device including a mounting substrate and a semiconductor chip mounted on the mounting substrate. The semiconductor chip includes, on a surface facing the mounting substrate, a plurality of first bumps each having a planar shape elongated in a first direction, the plurality of first bumps being arranged in a second direction perpendicular to the first direction. The mounting substrate includes, on a surface on which the semiconductor chip is mounted, a plurality of first lands connected to the respective first bumps, with each first land being larger than a first bump of the plurality of first bumps that is connected to the each first land in plan view. Some first bumps of the plurality of first bumps are offset in one direction with respect to the first lands connected to the some first lands, and other first bumps of the plurality of first bumps are offset in a direction opposite to the one direction with respect to the first lands connected to the other first bumps.

Due to the self-alignment effect at the edge of the first land and the edge of the first bump, faulty positioning of the semiconductor chip with respect to the mounting substrate is unlikely to occur.

Other features, elements, characteristics and advantages of the present disclosure will become more apparent from the following detailed description of preferred embodiments of the present disclosure with reference to the attached drawings.

DETAILED DESCRIPTION

First Example

With reference to FIGS. 1A to 4B, a semiconductor device in a first example will be described. The semiconductor device in the first example includes a mounting substrate and a semiconductor chip mounted on the mounting substrate.

Figure 1A:
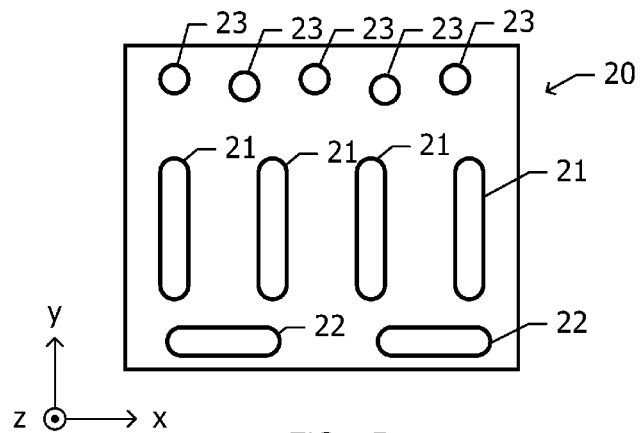
FIG. 1A is a view of the layout of the bumps when the semiconductor chip of a semiconductor device in a first example is viewed from the upper-surface side.

FIG. 1A is a view of the layout of the bumps when a semiconductor chip 20 of a semiconductor device in the first example is viewed from the upper-surface side.

The semiconductor chip 20 includes plural first bumps 21, plural second bumps 22, and plural third bumps 23 on a surface thereof facing the mounting substrate. The first bump 21, the second bump 22, and the third bump 23 each have a Cu pillar bump structure. The Cu pillar bump may include an under-bump metal layer on a pad and a Cu pillar disposed on the under-bump metal layer. On the upper surface of the Cu pillar, solder for connecting the bump to a land is disposed.

The first bumps 21 each have a shape elongated in a first direction in plan view and are arranged in a second direction perpendicular to the first direction. The XYZ orthogonal coordinate system in which the y-axis direction is the first direction and in which the x-axis direction is the second direction is set. In designing a layout by using, for example, a CAD tool, the first bumps 21 each have a rectangular planar shape elongated in the y-axis direction. In practice, in a manufacturing process, the corners of the rectangle are rounded, and thus, the planar shape of the first bump 21 is a rectangular shape with rounded corners or a racetrack shape.

The plural first bumps 21 have the same width (dimension in the x-axis direction). In the present specification, when patterns are compared with each other, if a difference in dimensions within the allowable limits of the patterns is generated due to manufacturing variations, it is assumed that the difference does not affect the results of the comparison. Furthermore, if faulty positioning of patterns designed to be aligned occurs within the allowable limit due to manufacturing variations, it is assumed that the patterns are "aligned".

The second bumps 22 each have a rectangular planar shape with rounded corners, or a racetrack planar shape elongated in the x-axis direction.

In each of the third bumps 23, the dimension in the x-axis direction is identical to the dimension in the y-axis direction. The third bumps 23 may each have a circular planar shape. In plan view, the area of each third bump 23 is smaller than the area of each first bump 21 and the area of each second bump 22.

Figure 1B:
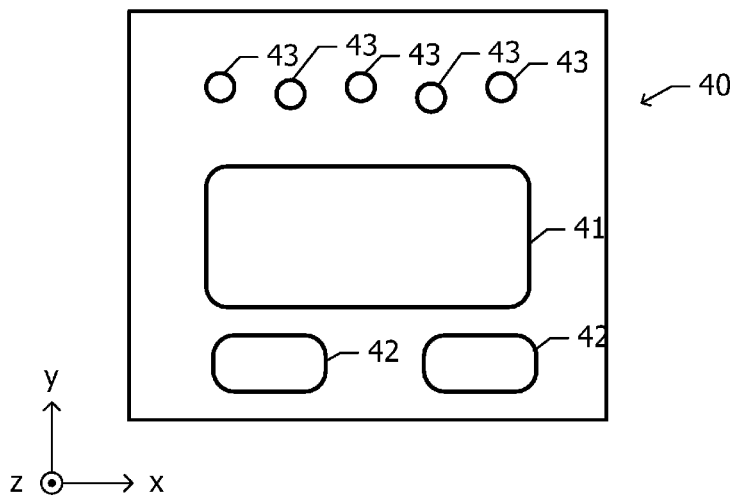
FIG. 1B is a view of the layout of the lands when a mounting substrate of the semiconductor device in the first example is viewed from the upper-surface side (mounting-surface side)

FIG. 1B is a view of the layout of the lands when a mounting substrate 40 of the semiconductor device in the first example is viewed from the upper-surface side (mounting-surface side).

The mounting substrate 40 includes, on the mounting surface thereof, a single first land 41 to which the plural first bumps 21 (FIG. 1A) are connected in the same manner. Furthermore, the mounting substrate 40 includes, on the mounting surface thereof, plural second lands 42 connected to the respective second bumps 22 (FIG. 1A) and plural third lands 43 connected to the respective third bumps 23 (FIG. 1A). The first lands 41 and the second lands 42 each have a rectangular or square planar shape with rounded corners, sides parallel to the x-axis, and the other sides parallel to the y-axis. The third lands 43 each have a circular planar shape.

Figure 1C:
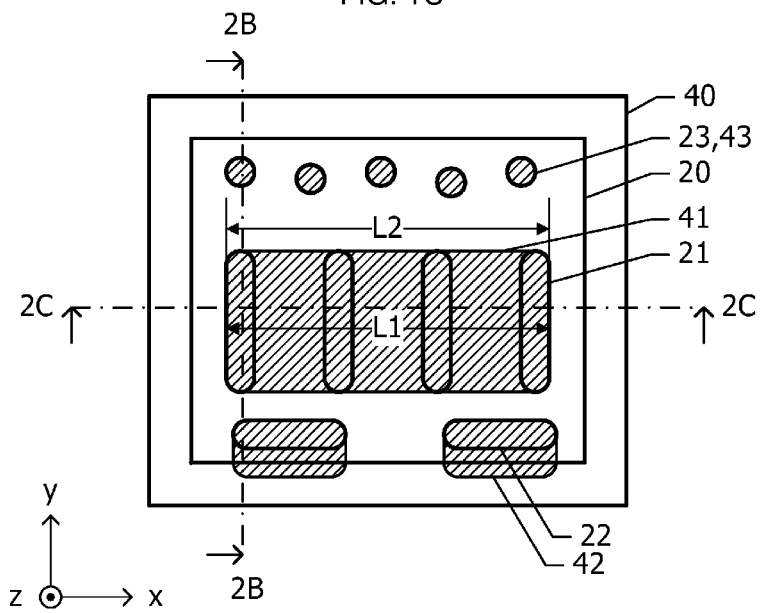
FIG. 1C illustrates the positional relationship between the bumps of a semiconductor chip and the lands of a mounting substrate in a state in which the semiconductor chip is mounted on the mounting substrate.

FIG. 1C illustrates the positional relationship between the bumps of the semiconductor chip 20 and the lands of the mounting substrate 40 in a state in which the semiconductor chip 20 is mounted on the mounting substrate 40. In FIG. 1C, to easily distinguish the lands and the bumps, the lands are hatched.

The plural first bumps 21 are connected to the single first land 41. Regarding edges of the first bumps 21 that are parallel to the y-axis, the outer edges of two first bumps 21 at the respective ends of the arranged first bumps in the x-axis direction overlap the respective edges of the first land 41 that are parallel to the y-axis, in plan view. Regarding edges of the first bumps 21 that are parallel to the y-axis, in a case in which the distance between the outer edges of two first bumps 21 at the respective ends of the arranged first bumps in the x-axis direction is denoted as L1, and in which the dimension of the first land 41 in the x-axis direction is denoted by L2, L1=L2.

Furthermore, first ends of the first bumps 21 in the y-axis direction and an edge of the first land 41 that is parallel to the x-axis are at the identical position in the y-axis direction, and second ends of the first bumps 21 in the y-axis direction and another edge of the first land 41 that is parallel to the x-axis are at the identical position in the y-axis direction. For example, when the first bumps 21 have the same length (dimension in the y-axis direction), the first land 41 has the minimum rectangular shape with rounded corners that covers the first bumps 21, in plan view.

The second bumps 22 are connected to the respective second lands 42. In plan view, the second land 42 covers the second bump 22 connected thereto. Regarding edges of the second bumps 22 and the second lands 42 that are parallel to the x-axis, edges of the second bumps 22 (edges at the positive side with respect to the other edges in the y-axis direction in FIG. 1C) and edges of the second lands 42 (edges at the positive side with respect to the other edges in the y-axis direction in FIG. 1C) overlap each other in plan view.

The third bumps 23 are connected to the respective third lands 43. The edges of the third bumps 23 overlap the respective edges of the third lands 43 in plan view. The size of the third bumps 23 may differ from the size of the third lands 43.

Figure 2A:
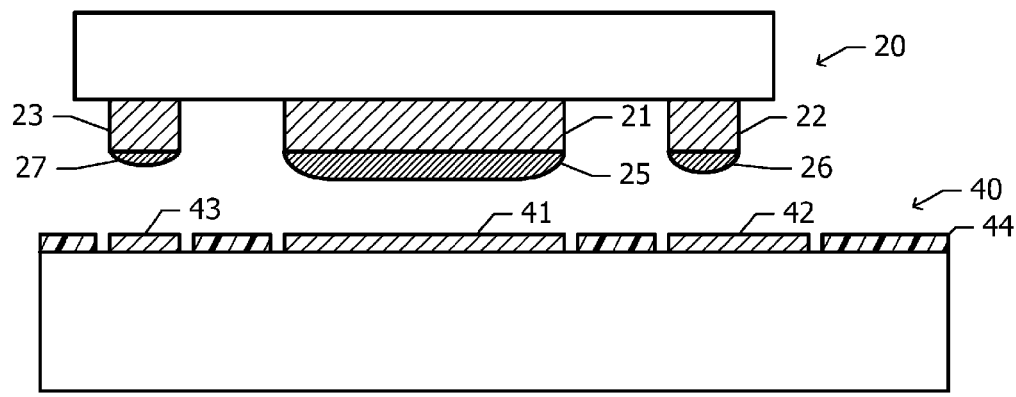
FIG. 2A is a cross-sectional view of a semiconductor chip and a mounting substrate before the semiconductor chip is mounted on the mounting substrate.

FIG. 2A is a cross-sectional view of the semiconductor chip 20 and the mounting substrate 40 before the semiconductor chip 20 is mounted on the mounting substrate 40. FIG. 2A corresponds to a cross-sectional view taken along long dashed short dashed line 2B-2B of FIG. 1C.

The semiconductor chip 20 includes the first bumps 21, the second bumps 22, and the third bumps 23 on a surface thereof facing the mounting substrate 40. Solders 25, 26, and 27 are respectively disposed on the upper surfaces of the first bump 21, the second bump 22, and the third bump 23. The area of the upper surface of the first bump 21 and the area of the upper surface of the second bump 22 are each larger than the area of the upper surface of the third bump 23 in plan view, and thus, the height of the solder 25 on the upper surface of the first bump 21 and the height of the solder 26 on the upper surface of the second bump 22 are each higher than the height of the solder 27 on the upper surface of the third bumps 23.

The mounting substrate 40 includes the first land 41, the second lands 42, and the third lands 43 on the mounting surface thereof. A region of the mounting surface on which the first land 41, the second lands 42, and the third lands 43 are not disposed is covered with a protection film 44. In plan view, a fine gap is reliably provided between the protection film 44 and each of the first land 41, the second land 42, and the third land 43. This is to prevent the protection film 44 from overlapping each land if faulty positioning occurs during the formation of the protection film.

Figure 2B:
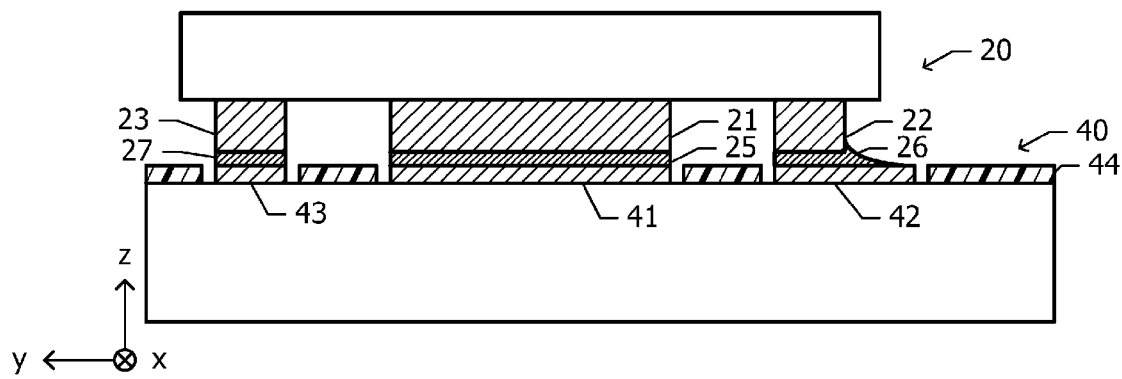
FIG. 2B and FIG. 2C respectively illustrate a cross-sectional view taken along long dashed short dashed line 2B-2B of FIG. 1C and a cross-sectional view taken along long dashed short dashed line 2C-2C of FIG. 1C.
Figure 2C:
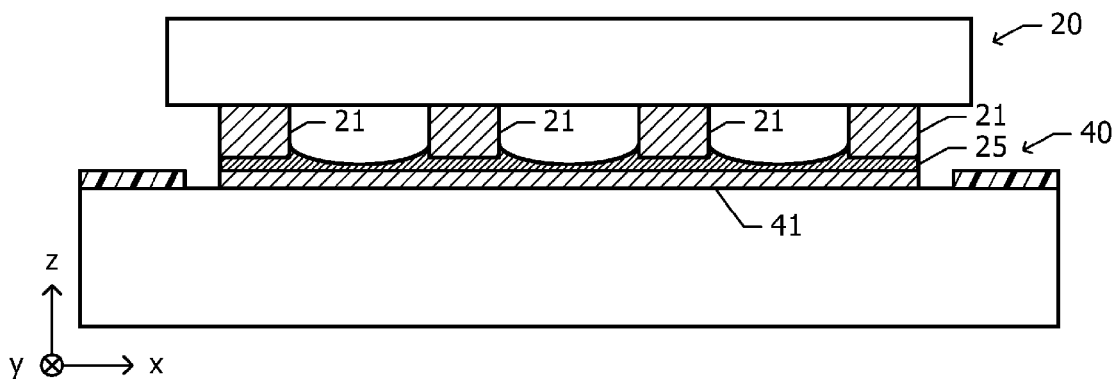

FIG. 2B and FIG. 2C respectively illustrate a cross-sectional view taken along long dashed short dashed line 2B-2B of FIG. 1C and a cross-sectional view taken along long dashed short dashed line 2C-2C of FIG. 1C. The solder 25 connects the first bump 21 and the first land 41 to each other, the solder 26 connects the second bump 22 and the second land 42 to each other, and the solder 27 connects the third bump 23 and the third land 43 to each other.

In a cross section perpendicular to the x-axis (FIG. 2B), regarding edges of the bumps 21 and 22 and the lands 41 and 42 that are perpendicular to the y-axis direction, one edge of the first bump 21 and one edge of the first land 41 are at the same position in the y-axis direction, the other edge of the first bump 21 and the other edge of the first land 41 are at the same position in the y-axis direction, and one edge of the second bump 22 (edge at the positive side with respect to the other edge in the y-axis direction) and one edge of the second land 42 (edge at the positive side with respect to the other edge in the y-axis direction) are at the same position in the y-axis direction. The other edge of the second bump 22 (edge at the negative side with respect to the other edge in the y-axis direction) is inside the second land 42 in the y-axis direction. Among the solder 26 disposed on the upper surface of the second bump 22 before mounting, excessive solder spreads in the lateral direction and covers substantially all the surface of the second land 42. Here, "excessive solder" refers to the solder that is not accommodated in a space between a bump and a land when the semiconductor chip 20 is mounted on the mounting substrate 40.

In a cross section perpendicular to the y-axis (FIG. 2C), one of the outer edges of the two first bump 21 at respective ends of the arranged first bumps 21 and an edge of the first land 41 are at the same position in the x-axis direction, and the other of the outer edges of the two first bumps 21 and another edge of the first land 41 are at the same position in the x-axis direction. The excessive solder of the solder 25 disposed on the upper surface of the first bump 21 before mounting (FIG. 2A) spreads in the lateral direction and covers substantially all the surface of the first land 41.

Figure 3:
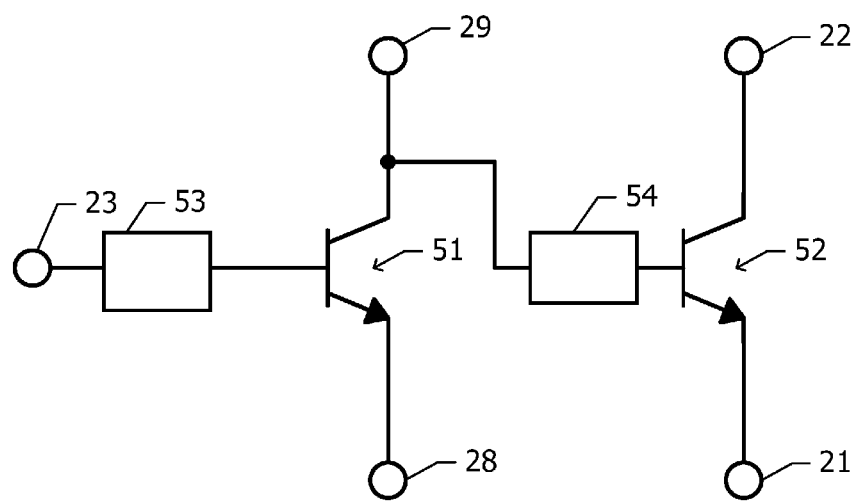
FIG. 3 is an equivalent circuit diagram of the semiconductor device in the first example.

FIG. 3 is an equivalent circuit diagram of the semiconductor device in the first example. A semiconductor device in the first example forms a high-frequency amplifier circuit including an initial stage transistor 51, an output stage transistor 52, and matching circuits 53 and 54. Plural heterojunction bipolar transistors connected to each other in parallel may be used as the initial stage transistor 51 and the output stage transistor 52. The emitter and the collector of the output stage transistor 52 are respectively connected to the first bump 21 and the second bump 22. From the second bump 22, electricity is supplied, and an amplified high-frequency signal is output. In FIG. 3, a bias circuit is not illustrated.

A single third bump 23 is connected to the base of the initial stage transistor 51 via the matching circuit 53. A high-frequency signal is input from such a third bump 23. The collector of the initial stage transistor 51 is connected to the base of the output stage transistor 52 via the matching circuit 54. The emitter and the collector of the initial stage transistor 51 are respectively connected to a bump 28 and a bump 29. The bumps 28 and 29 are not illustrated in FIG. 1A and FIG. 1C.

Next, an excellent effect exhibited in the first example will be described.

In the first example, as illustrated in FIG. 1C, regarding edges of the first bumps 21 that are parallel to the y-axis, the outer edge of the first bump at the positive side with respect to the other first bumps in the x-axis direction overlaps an edge of the first land 41 in plan view. Furthermore, regarding edges of the first bumps 21 that are parallel to the y-axis, the outer edge of the first bump at the negative side with respect to the other first bumps in the x-axis direction overlaps an edge of the first land 41 in plan view. Thus, the self-alignment effect in the x-axis direction is exhibited during mounting. Furthermore, the first ends of the first bumps 21, which are at the positive side with respect to the second ends in the y-axis direction, overlap an edge of the first land 41 that is parallel to the x-axis, in plan view. Furthermore, the second ends of the first bumps 21, which are at the negative side with respect to the first ends in the y-axis direction, overlap another edge of the first land 41 that is parallel to the x-axis, in plan view. Thus, the self-alignment effect in the y-axis direction is exhibited during mounting. The self-alignment effect suppresses faulty positioning of the semiconductor chip 20 with respect to the mounting substrate 40 and stabilizes the mounting position.

If the mounting position of the semiconductor chip 20 varies, the impedances with respect to the high-frequency signal may vary at the joints of bumps and lands. In the first example, stabilizing the mounting position of the semiconductor chip 20 leads to suppressing the variability of impedance with respect to the high-frequency signal. The first bump 21 and the first land 41 function as heat-dissipating paths that dissipate heat generated in the output stage transistor 52 (FIG. 3) in the semiconductor chip 20 into the mounting substrate 40. Suppressing the variability of the mounting position of the semiconductor chip 20 enables suppressing the variability of the heat-dissipating effect.

Suppressing the variability of the mounting position of the semiconductor chip 20 enables the third land 43 (FIG. 1B, FIG. 1C), which has a relatively small area, to be smaller. In the first example, the area of the third land 43 is substantially identical to the area of the third bump 23 in plan view. Smaller third lands 43 allow the pitch of the third lands 43 smaller or enable, for example, a wire to be disposed between two adjacent third lands 43.

In the first example, the first land 41 reliably has a region that does not overlap the first bumps 21 in plan view. The excessive solder of the solders 25 (FIG. 2A) disposed on the upper surfaces of the first bumps 21 covers a region in the upper surface of the first land 41 that does not overlap the first bumps 21. Because of this, an effect of suppressing the occurrence of, for example, a short circuit due to the excessive solder spreading to an unexpected region is exhibited. Furthermore, the height of the solder 25 on the upper surface of the first bump 21 and the height of the solder 27 on the upper surface of the third bump 23 can be equalized after mounting, although there is a difference in height between the solder 25 and the solder 27 before mounting, as illustrated in FIG. 2A.

Furthermore, in the first example, regarding edges of each second bump 22 that are perpendicular to the y-axis, one edge at the positive side with respect to the other edge in the y-axis direction overlaps an edge of the second land 42 in plan view in FIG. 1C. Thus, due to the self-alignment effect, faulty positioning of the semiconductor chip 20 to the positive side with respect to the mounting substrate 40 in the y-axis direction is suppressed. The effect of suppressing faulty positioning is thus enhanced, compared with a case in which positioning is performed by only the self-alignment effect at the first bumps 21 and the first land 41.

Furthermore, in the first example, the first bumps 21 are connected to the same single first land 41. Thus, the first land 41 is larger than a land in a case in which a land is provided for each first bump 21. The first land 41 is connected to the emitter of the output stage transistor 52 (FIG. 3) and functions as a ground conductor. Increasing the size of the first land 41 enables the effect of grounding to be enhanced. Furthermore, the first bump 21 also functions as a heat-dissipating path dissipating heat from the output stage transistor 52. Plural via conductors that extend from the first land 41 to a surface of the mounting substrate 40 that faces away from the first land 41, and that function as heat-dissipating paths are provided. Increasing the size of the first land 41 enables the number of via conductors that function as heat-dissipating paths to be increased. As a result, heat can be efficiently dissipated from the output stage transistor 52.

In the cross section illustrated in FIG. 2C, the self-alignment effect is exhibited at outer edges of the first bumps 21 at respective ends of the arranged first bumps 21 and at the outer edges of the first land 41. The slope of the surface of the solder 25 at a portion where the self-alignment effect is exhibited is steeper than that at another portion. The slope of the surface of the solder 25 at a portion where the edge of the first bump 21 and the edge of the first land 41 overlap each other as illustrated in FIG. 1C is steeper than that at another portion. Thus, the self-alignment effect is exhibited at a portion where the gradient of the surface of the solder is steep. For example, the shape of the cross section of the solder 25 is asymmetric between the left and right edges of each of the first bumps 21 at the respective ends of the arranged first bumps 21. Regarding the asymmetrical surfaces, the self-alignment effect is exhibited at the edge where the slope of the surface is steeper than the other.

Next, a modified first example will be described.

In the first example, the distance L1 between the first bumps 21 is identical to the length L2 of the first land 41 as illustrated in FIG. 1C. Here, "identical" and "the same" are also used in a case where a difference in dimension within the allowable limits is generated due to the manufacturing variations, as described in the first example. For example, when the difference between the distance L1 and the length L2 is 20 µm or less, the effect of suppressing faulty positioning is sufficiently exhibited due to the self-alignment effect. When the difference between the distance L1 and the length L2 is 25% or less of the diameter of the smallest enclosing circle of the smallest land of the lands disposed on the mounting surface of the mounting substrate 40, the effect of preventing faulty positioning is sufficiently exhibited.

The first bumps 21, the second bumps 22, and the third bumps 23 each have a Cu pillar bump structure in the first example, but may have another structure.

Next, with reference to FIG. 4A and FIG. 4B, the definition of land will be described. In FIG. 1B, the first land 41, the second lands 42, and the third lands 43 are each surrounded by a closed peripheral line; however, a wire may be pulled out from a land in the same layer.

Figure 4A:
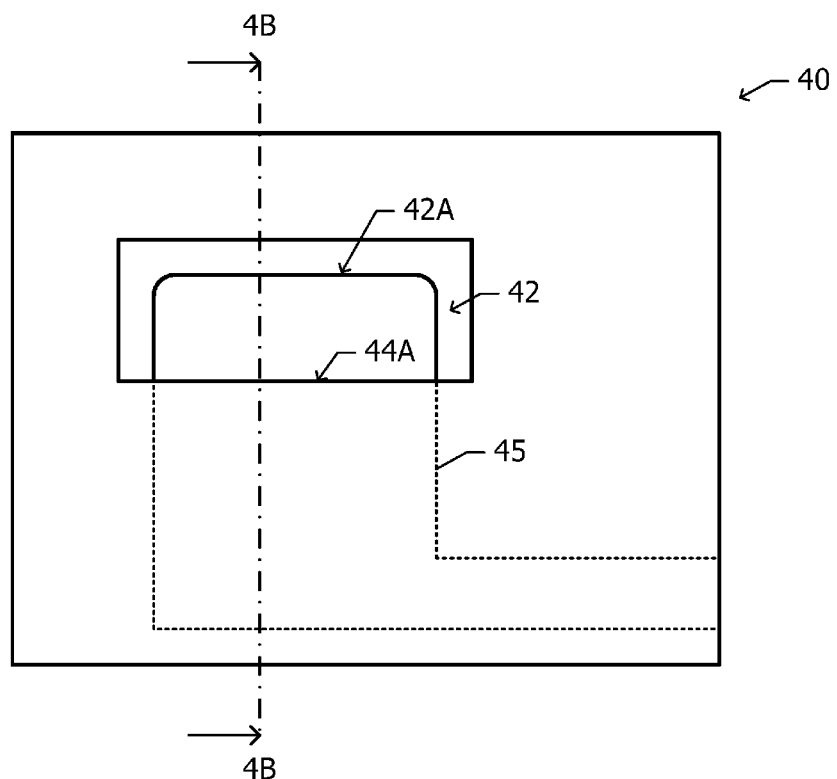
FIG. 4A is a view of the layout of a second land and a wire pulled out of the second land.
Figure 4B:
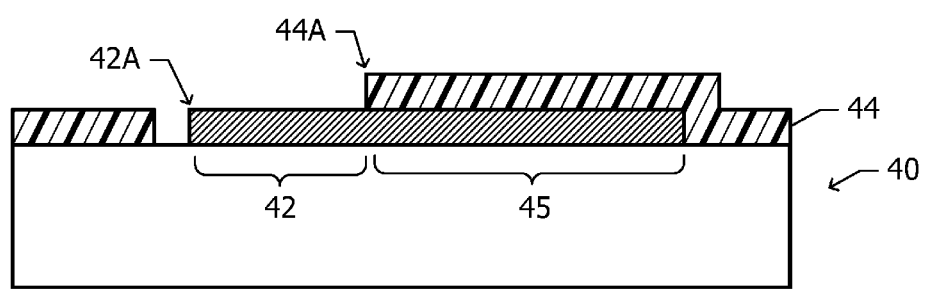
FIG. 4B is a cross-sectional view taken along long dashed short dashed line 4B-4B of FIG. 4A.

FIG. 4A is a view of the layout of the second land 42 and a wire 45 pulled out of the second land 42. FIG. 4B is a cross-sectional view taken along long dashed short dashed line 4B-4B of FIG. 4A. The second land 42 and the wire 45 are formed by using the same conductive pattern. The wire 45 is covered with the protection film 44, and the second land 42 is exposed.

A portion of the edges of the conductor pattern that is not covered with the protection film 44, the portion being denoted as a portion 42A, can be referred to as an edge of the second land 42. In the connecting portion between the second land 42 and the wire 45, an edge 44A of the protection film 44 is regarded as an edge of the second land 42. The edge 44A of the protection film 44 may also exhibit the self-alignment effect when the semiconductor chip 20 is mounted on the mounting substrate 40.

Next, with reference to FIG. 5, a semiconductor device in the modified first example will be described.

Figure 5:
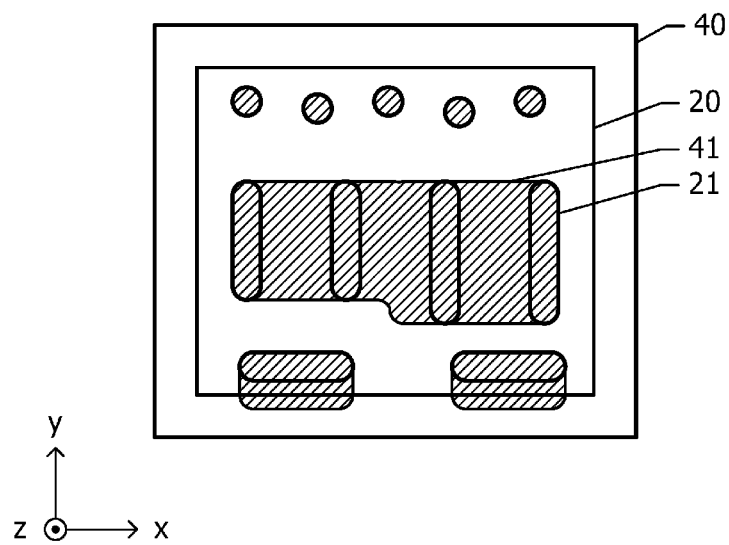
FIG. 5 illustrates the positional relationship between the bumps of a semiconductor chip and the lands of a mounting substrate of a semiconductor device in a modified first example.

FIG. 5 illustrates the positional relationship between the bumps of the semiconductor chip 20 and the lands of the mounting substrate 40 of the semiconductor device in the modified first example. In the first example, the first bumps 21 have substantially the same length. On the other hand, in the present modified example, the first bumps 21 do not have the same length. For example, two types of first bumps 21 such as relatively short first bumps 21 and relatively long first bumps 21 are provided.

The dimension of the first land 41 in the y-axis direction changes in accordance with the length of the first bumps 21. Thus, although the first bumps 21 have different lengths, the ends of the first bumps 21 in the y-axis direction overlap respective edges of the first land 41 in plan view. Therefore, the self-alignment effect in the y-axis direction is exhibited at each first bump 21. As a result, faulty positioning of the semiconductor chip 20 with respect to the mounting substrate 40 can be suppressed in the same manner as in the first example.

Second Example

Next, with reference to FIG. 6, a semiconductor device in a second example will be described. Hereinafter, the description of the structure common to the semiconductor device in the first example illustrated in FIG. 1A to FIG. 3 will be omitted.

Figure 6:
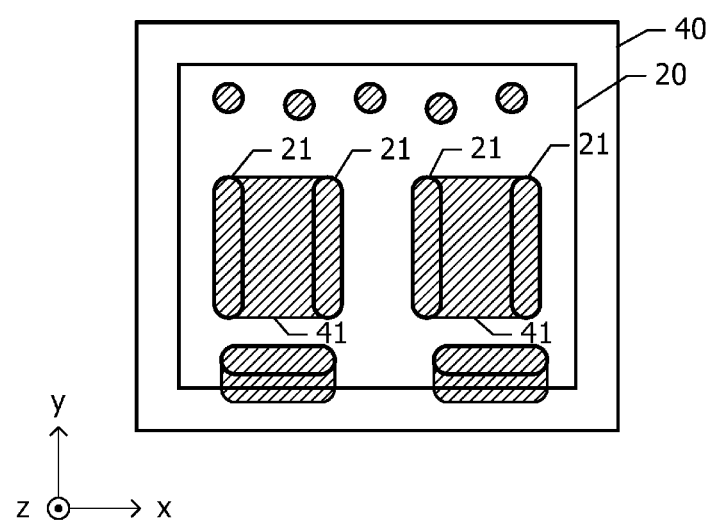
FIG. 6 illustrates the positional relationship between the bumps of a semiconductor chip and the lands of a mounting substrate of a semiconductor device in a second example.

FIG. 6 illustrates the positional relationship between the bumps of the semiconductor chip 20 and the lands of the mounting substrate 40 of the semiconductor device in the second example. In the first example, the first bumps 21 are connected to the single first land 41 (FIG. 1C). On the other hand, in the second example, the plural first lands 41 are provided. The first bumps 21 are connected to any one of the first lands 41. To each first land 41, the plural first bumps 21 are connected.

Regarding the single first land 41 and the plural first bumps 21 connected thereto, the positional relationship between the single first land 41 and the plural first bumps 21 is the same as that in the first example. In other words, each edge of the first lands 41 that is parallel to the y-axis overlaps an edge of any one of the first bumps 21 that is parallel to the y-axis, in plan view. Thus, the self-alignment effect in the x-axis direction is exhibited at edges of the first lands 41 that are parallel to the y-axis.

Next, an excellent effect of the second example will be described. The total dimension of edges that exhibit the self-alignment effect in the x-axis direction in the second example is longer than that in the first example. Thus, the self-alignment effect in the x-axis direction is enhanced, and therefore, the excellent effect in which faulty positioning of the semiconductor chip 20 with respect to the mounting substrate 40 in the x-axis direction is more unlikely to occur is exhibited.

Third Example

Next, with reference to FIG. 7, a semiconductor device in a third example will be described. Hereinafter, the description of the structure common to the semiconductor device in the second example illustrated in FIG. 6 will be omitted.

Figure 7:
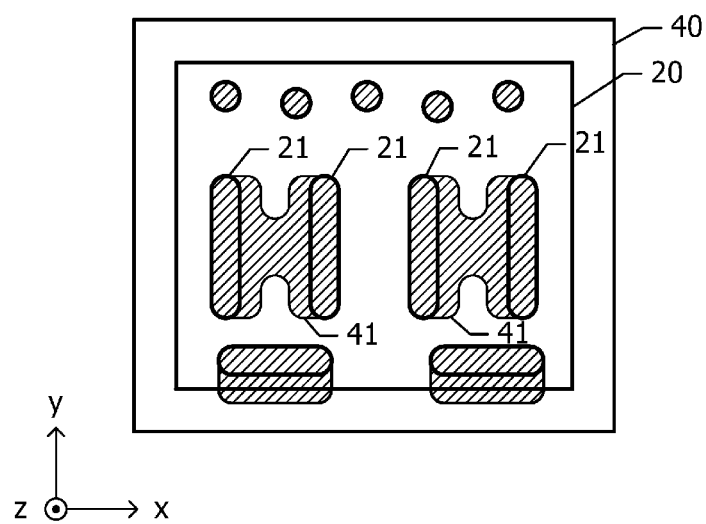
FIG. 7 illustrates the positional relationship between the bumps of a semiconductor chip and the lands of a mounting substrate of a semiconductor device in a third example.

FIG. 7 illustrates the positional relationship between the bumps of the semiconductor chip 20 and the lands of the mounting substrate 40 of the semiconductor device in the third example. In the second example, the first land 41 has a rectangular planar shape with rounded corners. In the third example, the first land 41 has a planar shape formed by bending the center portions of sides of a rectangle with rounded corners inward, the sides being parallel to the x-axis. In other words, in plan view, the first land 41 has an edge curved inward of the first land 41 with respect to a straight line connecting the corresponding ends of adjacent two of the first bumps 21 connected to the first land 41, the corresponding ends being at an identical position in the y-axis direction.

Next, an excellent effect of the third example will be described.

Changing the width and depth of the concave portion of the curved edge of the first land 41 enables the area of the first land 41 to be adjusted without changing the state in which edges of the first lands 41 that are parallel to the y-axis overlap the respective edges of the first bump 21 that are parallel to the y-axis, in plan view. The area of the first land 41 is preferably adjusted in accordance with the volume of the excessive solder of the solder 25 (FIG. 2A) on the upper surface of the first bump 21. In the third example, the area of the first land 41 can be adjusted in accordance with the volume of the excessive solder.

Fourth Example

Next, with reference to FIG. 8, a semiconductor device in a fourth example will be described. Hereinafter, the description of the structure common to the semiconductor device in the first example illustrated in FIG. 1A to FIG. 3 will be omitted.

Figure 8:
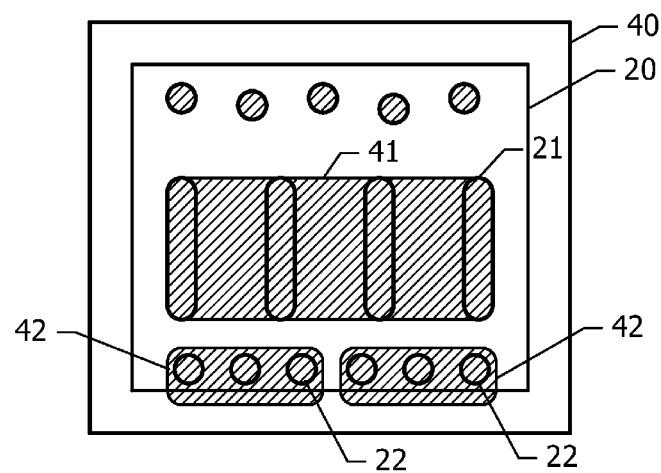
FIG. 8 illustrates the positional relationship between the bumps of a semiconductor chip and the lands of a mounting substrate of a semiconductor device in a fourth example.

FIG. 8 illustrates the positional relationship between the bumps of the semiconductor chip 20 and the lands of the mounting substrate 40 of the semiconductor device in the fourth example. In the first example, the second bump 22 has a rectangular planar shape with rounded corners that is elongated in the x-axis direction (FIG. 1A, FIG. 1C). On the other hand, in the fourth example, the second bump 22 has a circular planar shape. In the fourth example, the three circular second bumps 22 are provided in place of the single second bump 22 having a rectangular shape with rounded corners in the first example. The three second bumps 22 are connected to the single second land 42.

Next, an excellent effect of the fourth example will be described.

Also, in the fourth example, due to the plural first bumps 21 and the single first land 41, the self-alignment effect is sufficiently exhibited. Thus, faulty positioning of the semiconductor chip 20 with respect to the mounting substrate 40 can be suppressed.

Fifth Example

Next, with reference to FIG. 9A, a semiconductor device in a fifth example will be described. Hereinafter, the description of the structure common to the semiconductor device in the second example illustrated in FIG. 6 will be omitted.

Figure 9A:
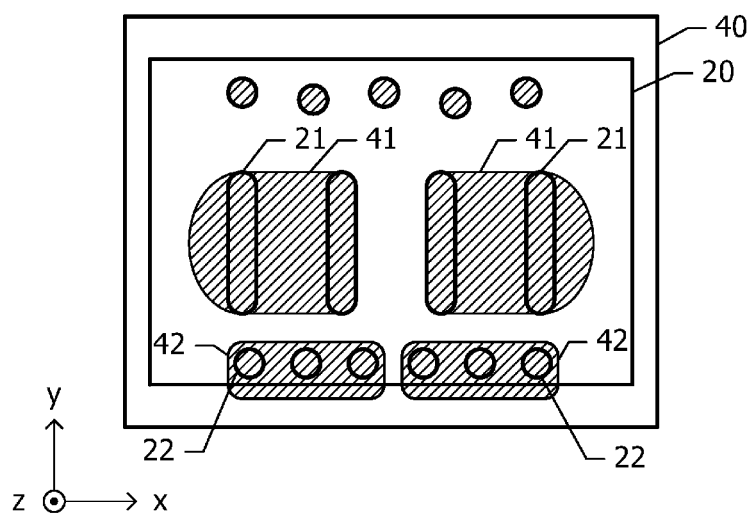
FIG. 9A illustrates the positional relationship between the bumps of a semiconductor chip and the lands of a mounting substrate of a semiconductor device in a fifth example.

FIG. 9A illustrates the positional relationship between the bumps of the semiconductor chip 20 and the lands of the mounting substrate 40 of the semiconductor device in the fifth example. In the second example, the first land 41 has a rectangular planar shape with rounded corners (FIG. 6). On the other hand, in the fifth example, the first land 41 has a planar shape formed by bending a side of a rectangle with rounded corners, the side being parallel to the y-axis, outward so as to make an arc. Regarding edges of each first land 41 that are not parallel to the x-axis, in one first land 41, one edge at the positive side with respect to the other edge in the x-axis direction curves outward so as to make an arc, and in the other first land 41, one edge at the negative side with respect to the other edge in the x-axis direction curves outward so as to make an arc. The second bump 22 has a circular planar shape the same as that in the fourth example (FIG. 8).

Next, an excellent effect of the fifth example will be described.

In the fifth example, an edge of each first land 41 that does not curve and that is parallel to the y-axis overlaps an edge of the first bump 21 in plan view. Regarding edges of each first land 41 that are not parallel to the x-axis, in one first land 41, one edge at the positive side with respect to the other edge in the x-axis direction overlaps an edge of the first bump 21, and in the other first land 41, one edge at the negative side with respect to the other edge in the x-axis direction overlaps an edge of the first bump 21. Thus, also in the fifth example, the self-alignment effect in the x-axis direction is exhibited.

When the first bump 21 at the position corresponding to the arc-shaped edge of the first land 41 is displaced toward the outside of the first land 41 in the x-axis direction, both ends of the first bump 21 protrude out of the first land 41 in plan view. Thus, the self-alignment effect is also exhibited to some extent at the arc-shaped edge of the first land 41. As a result, the self-alignment effect is enhanced as a whole, and thus, the effect of suppressing faulty positioning of the semiconductor chip 20 with respect to the mounting substrate 40 is enhanced.

In the fifth example, the area of the first land 41 is larger than the area of the first land 41 in the second example (FIG. 6). When the area of the first land 41 is insufficient with respect to the volume of the excessive solder in the structure of the second example, using the structure of the fifth example is effective.

Furthermore, in the fifth example, the number of via conductors that extend from the first land 41 to a surface of the mounting substrate 40 (FIG. 2C) that faces away from the first land 41, and that function as heat dissipating paths can be more increased than the number of via conductors of the semiconductor device in the second example illustrated in FIG. 6. As a result, the heat dissipation efficiency can be enhanced.

Next, with reference to FIG. 9B, a modified fifth example will be described.

Figure 9B:
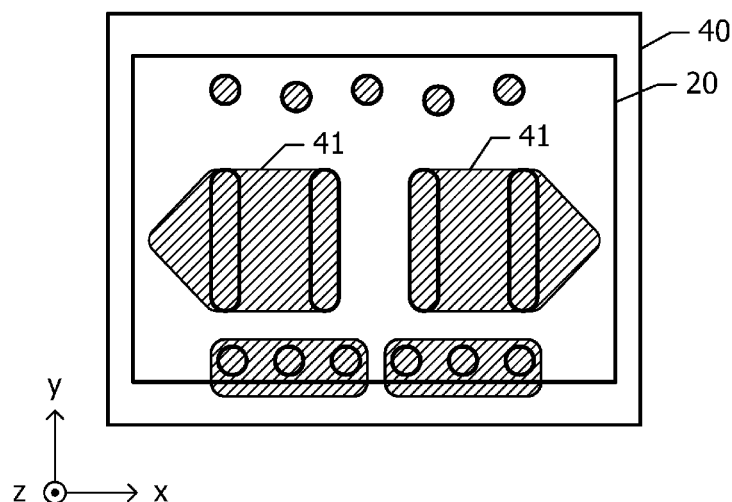
FIG. 9B illustrates the positional relationship between the bumps of a semiconductor chip and the lands of a mounting substrate of a semiconductor device in a modified fifth example.

FIG. 9B illustrates the positional relationship between the bumps of the semiconductor chip 20 and the lands of the mounting substrate 40 of a semiconductor device in the modified fifth example. In the fifth example, the first land 41 has a planar shape formed by bending a side of a rectangle with rounded corners outward so as to make an arc. On the other hand, in the modified example in FIG. 9B, the first land 41 has a planar shape formed by bending a side of a rectangle with rounded corners outward so as to make a triangle. In the present modified example, the excellent effect is exhibited in the same manner as in the fifth example.

Sixth Example

Next, with reference to FIG. 10, a semiconductor device in a sixth example will be described. Hereinafter, the description of the structure common to the semiconductor device in the first example illustrated in FIG. 1A to FIG. 3 will be omitted.

Figure 10:
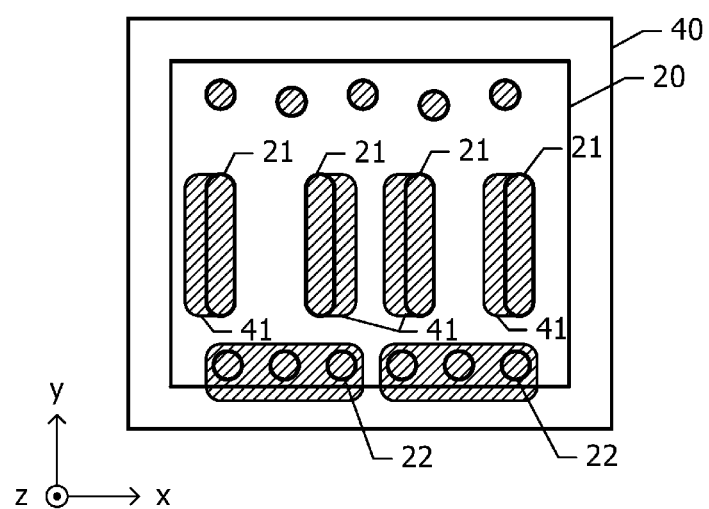
FIG. 10 illustrates the positional relationship between the bumps of a semiconductor chip and the lands of a mounting substrate of a semiconductor device in a sixth example.

FIG. 10 illustrates the positional relationship between the bumps of the semiconductor chip 20 and the lands of the mounting substrate 40 of the semiconductor device in the sixth example. In the first example (FIG. 1C), the plural first bumps 21 are connected to the same single first land 41. On the other hand, in the sixth example, the plural first bumps 21 are connected to the respective first lands 41. The first bumps 21 and the first lands 41 are connected to each other on a one-to-one basis. The second bumps 22 each have a circular planar shape in the same manner as in the fourth example (FIG. 8).

The first lands 41 each have a rectangular planar shape with rounded corners that is elongated in the y-axis direction. The first lands 41 each have a length (dimension in the y-axis direction) identical to the length (dimension in the y-axis direction) of the first bump 21. The first lands 41 each have a width (dimension in the x-axis direction) larger than the width (dimension in the x-axis direction) of the first bump 21.

In some pairs of the first bump 21 and the first land 41 connected to each other, regarding edges of the first bumps 21 and the first lands 41 that are parallel to the y-axis, one edge of the first bump 21 that is at the positive side with respect to the other edge in the x-axis direction and one edge of the first land 41 that is at the positive side with respect to the other edge in the x-axis direction overlap each other in plan view. In the other pairs of the first bump 21 and the first land 41, one edge of the first bump that is at the negative side with respect to the other edge in the x-axis direction and one edge of the first land that is at the negative side with respect to the other edge in the x-axis direction overlap each other in plan view.

Next, an excellent effect of the sixth example will be described. In the sixth example, the self-alignment effect is exhibited in the x-axis direction in the same manner as in the first example, since an edge of the first land 41 that is parallel to the y-axis overlaps an edge of the first bump 21 that is parallel to the y-axis. Furthermore, the length of the first land 41 and the length of the first bump 21 are the same with each other, and thus, the self-alignment effect is also exhibited in the y-axis direction. Therefore, faulty positioning of the semiconductor chip 20 with respect to the mounting substrate 40 can be suppressed.

Next, a modified sixth example will be described. In the sixth example, an edge of the first land 41 that is parallel to the y-axis and an edge of the first bump 21 that is parallel to the y-axis overlap each other in plan view; however, the two edges does not necessarily overlap each other. In the modified example, in plan view, the first bump 21 is offset in the x-axis direction with respect to the first land 41 connected thereto. In other words, the geometric center of the first bump 21 is offset in the x-axis direction with respect to the geometric center of the first land 41. Furthermore, in plan view, some first bumps 21 of the plural first bumps 21 are offset in one direction with respect to the first lands 41 connected to such first bumps 21, and the other first bumps 21 of the plural first bumps 21 are offset in a direction opposite to the one direction with respect to the first lands 41 connected to the other first bumps 21.

In the present modified example, in mounting the semiconductor chip 20 on the mounting substrate 40, when an edge of the first bump 21 that is parallel to the y-axis is offset in the x-axis direction to an edge of the first land 41 connected the first bump, the edge being parallel to the y-axis, the self-alignment effect is exhibited. Until the self-alignment effect is exhibited, the offset is smaller in the present modified example than that in a case in which the first bump 21 is disposed in the center of the first land 41. Thus, the offset of the semiconductor chip 20 with respect to the mounting substrate 40 can be decreased.

Seventh Example

Next, with reference to FIG. 11A, a semiconductor device in a seventh example will be described. Hereinafter, the description of the structure common to the semiconductor device in the sixth example illustrated in FIG. 10 will be omitted.

Figure 11A:
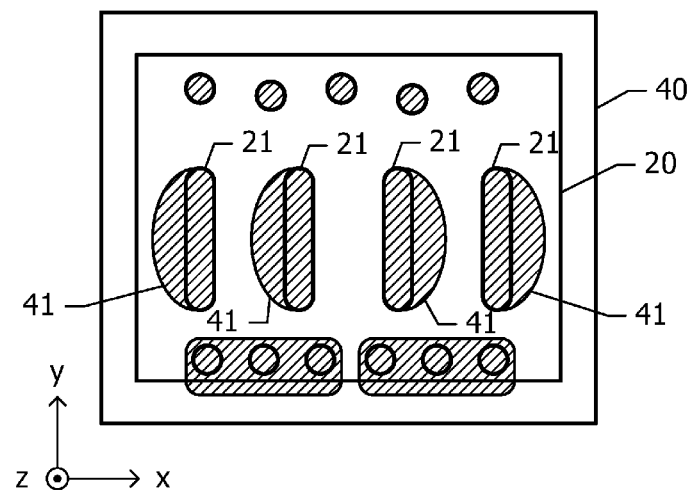
FIG. 11A illustrates the positional relationship between the bumps of a semiconductor chip and the lands of a mounting substrate of a semiconductor device in a seventh example.

FIG. 11A illustrates the positional relationship between the bumps of the semiconductor chip 20 and the lands of the mounting substrate 40 of the semiconductor device in the seventh example. In the sixth example, the first land 41 has a rectangular planar shape with rounded corners. On the other hand, in the seventh example, the first land 41 has a planar shape formed by bending a side of a rectangle with rounded corners, the side being parallel to the y-axis, outward so as to make an arc. The original rectangular shape is the same as the shape of the first bump 21. Edges of the first land 41 that do not curve overlap the respective edges of the first bump 21 connected to the first land 41, in plan view. Regarding edges of the first lands 41 that are not parallel to the x-axis, in each of some first lands 41, one edge at the positive side with respect to the other edge in the x-axis direction overlaps an edge of the first bump 21, and in each of the other first lands, one edge at the negative side with respect to the other edge overlaps an edge of the first bump 21.

Next, an excellent effect of the seventh example will be described.

In the seventh example, the self-alignment effect is exhibited in the x-axis direction in the same manner as in the sixth example, since an edge of the first land 41 that is parallel to the y-axis overlaps an edge of the first bump 21. In the seventh example, the self-alignment effect is exhibited to some extent at the arc-shaped edge of the first land 41 in the same manner as in the fifth example (FIG. 9A). Thus, the self-alignment effect is more significantly exhibited in the present example than that in the sixth example (FIG. 10). As a result, the effect of suppressing faulty positioning of the semiconductor chip 20 with respect to the mounting substrate 40 is enhanced.

Next, with reference to FIG. 11B, a semiconductor device in a modified seventh example will be described.

Figure 11B:
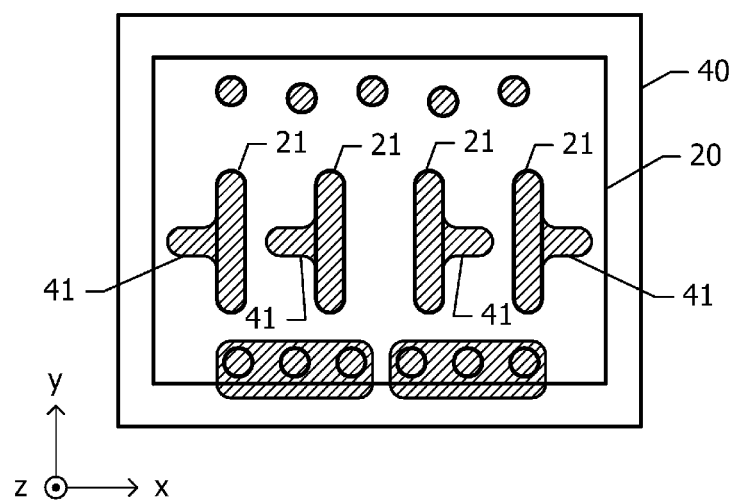
FIG. 11B illustrates the positional relationship between the bumps of a semiconductor chip and the lands of a mounting substrate of a semiconductor device in a modified seventh example.

FIG. 11B illustrates the positional relationship between the bumps of the semiconductor chip 20 and the lands of the mounting substrate 40 of the semiconductor device in the modified seventh example. In the present modified example, the first land 41 has an edge with a protruded portion, formed by protruding the center portion of a side of a rectangle with rounded corners, the side being parallel to the y-axis, instead of an arc-shaped edge formed by bending the side of the rectangle with rounded corners. The original rectangular shape is the same as the shape of the first bump 21. Accordingly, the first land 41 has a T-shaped planar shape.

In the modified example illustrated in FIG. 11B, an edge of the first land 41 that does not include a protruded portion and that is parallel to the y-axis overlaps an edge of the first bump 21 in plan view, and an edge with a protruded portion also partially overlaps an edge of the first bump 21 in plan view. Thus, the self-alignment effect is more significantly exhibited in the present example than in the seventh example.

It is to be understood that the above examples are illustrative and that elements described in different examples can be partially replaced and combined with each other. The same functions and effects provided by the same structure will not be described in each example. Furthermore, the present disclosure is not limited to the above examples. For example, it will be obvious for those skilled in the art that various modifications, improvements, and combinations are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a mounting substrate; and
   a semiconductor chip mounted on the mounting substrate, wherein
   the semiconductor chip includes a plurality of first bumps on a surface facing the mounting substrate, the plurality of first bumps each having a shape elongated in a first direction in plan view and being arranged in a second direction perpendicular to the first direction,
   the mounting substrate includes, on a surface on which the semiconductor chip is mounted, at least one first land connected to the plurality of first bumps, at least two first bumps of the plurality of first bumps being connected to each first land,
   a difference between a dimension of the first land in the second direction and a distance between outer edges of two first bumps at respective ends of the arranged first bumps connected to the first land is 20 µm or less,
   the at least one first land includes a plurality of first lands, and
   at least two first bumps of the plurality of first bumps are connected to each first land.

2. The semiconductor device according to claim 1, wherein the dimension of the first land in the second direction is identical to the distance between outer edges of two first bumps at respective ends of the arranged first bumps connected to the first land.

3. The semiconductor device according to claim 1, wherein, in plan view, the first land has an edge curved inward of the first land with respect to a straight line connecting corresponding ends of adjacent two first bumps of the first bumps connected to the first land, the corresponding ends being at an identical position in the first direction.

4. The semiconductor device according to claim 1, wherein
   first ends of the plurality of first bumps in the first direction are aligned with each other in the second direction, second ends of the plurality of first bumps in the first direction are aligned with each other in the second direction, and
   a dimension of the first land in the first direction is identical to a dimension in the first direction of the first bumps connected to the first land.

5. The semiconductor device according to claim 1, wherein
   the semiconductor chip further includes, on a surface facing the mounting substrate, a plurality of second bumps having smaller planar shape than the plurality of the first bumps, and
   the mounting substrate includes at least one second land connected to the plurality of second bumps on a surface on which the semiconductor chip is mounted, each second land being connected to at least two bumps of the plurality of second bumps.

6. The semiconductor device according to claim 2, wherein
   the at least one first land includes a plurality of first lands, and
   at least two first bumps of the plurality of first bumps are connected to each first land.

7. The semiconductor device according to claim 2, wherein, in plan view, the first land has an edge curved inward of the first land with respect to a straight line connecting corresponding ends of adjacent two first bumps of the first bumps connected to the first land, the corresponding ends being at an identical position in the first direction.

8. The semiconductor device according to claim 6, wherein, in plan view, the first land has an edge curved inward of the first land with respect to a straight line connecting corresponding ends of adjacent two first bumps of the first bumps connected to the first land, the corresponding ends being at an identical position in the first direction.

9. The semiconductor device according to claim 2, wherein
first ends of the plurality of first bumps in the first direction are aligned with each other in the second direction, second ends of the plurality of first bumps in the first direction are aligned with each other in the second direction, and
a dimension of the first land in the first direction is identical to a dimension in the first direction of the first bumps connected to the first land.

10. The semiconductor device according to claim 3, wherein
first ends of the plurality of first bumps in the first direction are aligned with each other in the second direction, second ends of the plurality of first bumps in the first direction are aligned with each other in the second direction, and
a dimension of the first land in the first direction is identical to a dimension in the first direction of the first bumps connected to the first land.

11. The semiconductor device according to claim 6, wherein
first ends of the plurality of first bumps in the first direction are aligned with each other in the second direction, second ends of the plurality of first bumps in the first direction are aligned with each other in the second direction, and
a dimension of the first land in the first direction is identical to a dimension in the first direction of the first bumps connected to the first land.

12. The semiconductor device according to claim 2, wherein
the semiconductor chip further includes, on a surface facing the mounting substrate, a plurality of second bumps having smaller planar shape than the plurality of the first bumps, and
the mounting substrate includes at least one second land connected to the plurality of second bumps on a surface on which the semiconductor chip is mounted, each second land being connected to at least two bumps of the plurality of second bumps.

13. The semiconductor device according to claim 3, wherein
the semiconductor chip further includes, on a surface facing the mounting substrate, a plurality of second bumps having smaller planar shape than the plurality of the first bumps, and
the mounting substrate includes at least one second land connected to the plurality of second bumps on a surface on which the semiconductor chip is mounted, each second land being connected to at least two bumps of the plurality of second bumps.

14. The semiconductor device according to claim 4, wherein
the semiconductor chip further includes, on a surface facing the mounting substrate, a plurality of second bumps having smaller planar shape than the plurality of the first bumps, and
the mounting substrate includes at least one second land connected to the plurality of second bumps on a surface on which the semiconductor chip is mounted, each second land being connected to at least two bumps of the plurality of second bumps.

15. A semiconductor device comprising:
a mounting substrate; and
a semiconductor chip mounted on the mounting substrate,
wherein the semiconductor chip includes, on a surface facing the mounting substrate, a plurality of first bumps each having a planar shape elongated in a first direction, the plurality of first bumps being arranged in a second direction perpendicular to the first direction,
the mounting substrate includes, on a surface on which the semiconductor chip is mounted, a plurality of first lands connected to the respective first bumps, each first land being larger than a first bump of the plurality of first bumps that is connected to the each first land in plan view, some first bumps of the plurality of first bumps being offset in one direction with respect to the first lands connected to the some first lands, and other first bumps of the plurality of first bumps being offset in a direction opposite to the one direction with respect to the first lands connected to the other first bumps.

16. The semiconductor device according to claim 15, wherein, in plan view, an edge of each first bump that is parallel to the first direction overlaps an edge of the first land connected to the each first bump.

17. A semiconductor device comprising:
a mounting substrate; and
a semiconductor chip mounted on the mounting substrate, wherein
the semiconductor chip includes a plurality of first bumps on a surface facing the mounting substrate, the plurality of first bumps each having a shape elongated in a first direction in plan view and being arranged in a second direction perpendicular to the first direction,
the mounting substrate includes, on a surface on which the semiconductor chip is mounted, at least one first land connected to the plurality of first bumps, at least two first bumps of the plurality of first bumps being connected to each first land,
a difference between a dimension of the first land in the second direction and a distance between outer edges of two first bumps at respective ends of the arranged first bumps connected to the first land is 20 µm or less,
the semiconductor chip further includes, on a surface facing the mounting substrate, a plurality of second bumps having smaller planar shape than the plurality of the first bumps, and
the mounting substrate includes at least one second land connected to the plurality of second bumps on a surface on which the semiconductor chip is mounted, each second land being connected to at least two bumps of the plurality of second bumps.

* * * * *